United States Patent
Escamilla et al.

(10) Patent No.: US 12,484,168 B2
(45) Date of Patent: Nov. 25, 2025

(54) SERVER SYSTEM SERVER COVER LATCH SYSTEM

(71) Applicant: Dell Products L.P., Round Rock, TX (US)

(72) Inventors: Eduardo Escamilla, Round Rock, TX (US); Raymond DeWine Heistand, II, Round Rock, TX (US); Timothy Morgan Evans, Georgetown, TX (US)

(73) Assignee: Dell Products, L.P., Round Rock, TX (US)

( * ) Notice: Subject to any disclaimer, the term of this patent is extended or adjusted under 35 U.S.C. 154(b) by 168 days.

(21) Appl. No.: 18/511,188

(22) Filed: Nov. 16, 2023

(65) Prior Publication Data

US 2025/0169018 A1 May 22, 2025

(51) Int. Cl.
*H05K 5/02* (2006.01)
*H05K 7/14* (2006.01)

(52) U.S. Cl.
CPC ......... *H05K 5/0221* (2013.01); *H05K 7/1489* (2013.01)

(58) Field of Classification Search
None
See application file for complete search history.

(56) References Cited

U.S. PATENT DOCUMENTS

| | | | | |
|---|---|---|---|---|
| 10,624,223 B1* | 4/2020 | Tsorng | ................... | H05K 5/023 |
| 11,665,840 B1* | 5/2023 | O'Donnell | ........... | H05K 7/1409 |
| | | | | 361/801 |
| 2012/0275850 A1* | 11/2012 | Lee | ..................... | H05K 5/0221 |
| | | | | 403/299 |
| 2016/0143165 A1* | 5/2016 | Wang | ................... | H05K 5/0221 |
| | | | | 361/679.58 |
| 2020/0396858 A1* | 12/2020 | Wu | ....................... | H05K 7/1489 |
| 2021/0198926 A1* | 7/2021 | Tsorng | ..................... | E05C 1/12 |

* cited by examiner

*Primary Examiner* — Allen L Parker
*Assistant Examiner* — Christopher L Augustin
(74) *Attorney, Agent, or Firm* — Terrile, Cannatti & Chambers, LLP; Stephen A. Terrile

(57) ABSTRACT

A server cover latch system. The server cover latch system includes a top panel; and, a server cover latch coupled to the top panel; the server cover latch comprising a rotating bracket component; a receptor bracket component, the rotating bracket component pivoting about a portion of the receptor bracket component when the rotating bracket component pivots between a latch open orientation and a latch closed orientation; and a bottom housing portion physically coupled to the top panel, the receptor bracket component moving laterally within the bottom housing portion when the rotating bracket component pivots between a latch open orientation and a latch closed orientation.

12 Claims, 11 Drawing Sheets

SERVER SYSTEM SERVER COVER LATCH SYSTEM

BACKGROUND OF THE INVENTION

Field of the Invention

The present invention relates to information handling systems. More specifically, embodiments of the invention relate to server type information handling systems within information technology (IT) environments.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

It is known to use information handling systems and related IT systems within information technology (IT) environments such as data centers.

SUMMARY OF THE INVENTION

A system and method for a server type information handling system with a server cover captive screw latch system.

In one embodiment, the invention relates to a server cover latch comprising a rotating bracket component; a receptor bracket component, the rotating bracket component pivoting about a portion of the receptor bracket component when the rotating bracket component pivots between a latch open orientation and a latch closed orientation; and a bottom housing portion physically coupled to the top panel, the receptor bracket component moving laterally within the bottom housing portion when the rotating bracket component pivots between a latch open orientation and a latch closed orientation.

In another embodiment, the invention relates to a server cover latch system comprising a top panel; and, a server cover latch coupled to the top panel; the server cover latch comprising a rotating bracket component; a receptor bracket component, the rotating bracket component pivoting about a portion of the receptor bracket component when the rotating bracket component pivots between a latch open orientation and a latch closed orientation; and a bottom housing portion physically coupled to the top panel, the receptor bracket component moving laterally within the bottom housing portion when the rotating bracket component pivots between a latch open orientation and a latch closed orientation.

In another embodiment, the invention relates to a system comprising: a chassis; a processor contained within the chassis; a data bus coupled to the processor; and, a server cover latch system comprising: a top panel; and, a server cover latch coupled to the top panel; the server cover latch comprising a rotating bracket component; a receptor bracket component, the rotating bracket component pivoting about a portion of the receptor bracket component when the rotating bracket component pivots between a latch open orientation and a latch closed orientation; and a bottom housing portion physically coupled to the top panel, the receptor bracket component moving laterally within the bottom housing portion when the rotating bracket component pivots between a latch open orientation and a latch closed orientation.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Various aspects of the disclosure include an appreciation that it is known to provide information handling systems such as server type information handling systems with a top cover which includes a camming latch. The camming action locks the cover and engages structural and electrical grounding tie-ins to the chassis. Various aspects of the disclosure include an appreciation that with certain server type information handling systems, such as 1U rack unit server type information handling systems, the density of the information handling system can limit the available volume for the latch. As a result, a 1U latch is often significantly more expensive than a 2U latch. Various aspects of the disclosure include an appreciation that a large contributor to the cost difference is the locking screw used by known 1U latches. With many known latches, the latch uses a quarter-turn screw, however, the 1U screw is often a casted part whereas the 2U latch is a plastic part.

Various aspects of the disclosure include an appreciation that a captive screw implementation would be cheaper than the cast quarter-turn solution. However, such a captive screw implementation is often difficult to implement in the same volume as the quarter-turn solution. For example, a captive screw should not spring above the cover surface when it is unfastened because it will interfere with the racking of the server above it. Various aspects of the disclosure include an appreciation that it would be desirable to provide a latch solution with a limited height to fit all the needed elements of a captured screw solution.

A system and method are disclosed for providing latch having a captive screw with a limited height to fit within a dense server type information handling system such as a 1U rack unit server type information handling system.

In certain embodiments, the latch is included within a server cover captive screw latch system. In certain embodiments, the latch includes an over-molded bracket capture screw component. In certain embodiments, the screw component includes a head, a shoulder, a non-threaded area, and a threaded area. In certain embodiments, the threaded area threads into an internal bracket of the latch and then can float within the non-threaded portion of the screw. In certain embodiments, the screw component includes a spring which biases the screw component toward the cover of the latch but would require a much larger upward force for the screw thread to engage and be removed. Therefore, the screw component is captured onto the latch lever with no chance of being completely unintentionally removed. Such a server cover captive screw latch system provides a low-cost solution that reliably locks a cover latch in the limited space of a dense server type information handling system such as a 1U rack unit server type information handling system.

Figure 1:
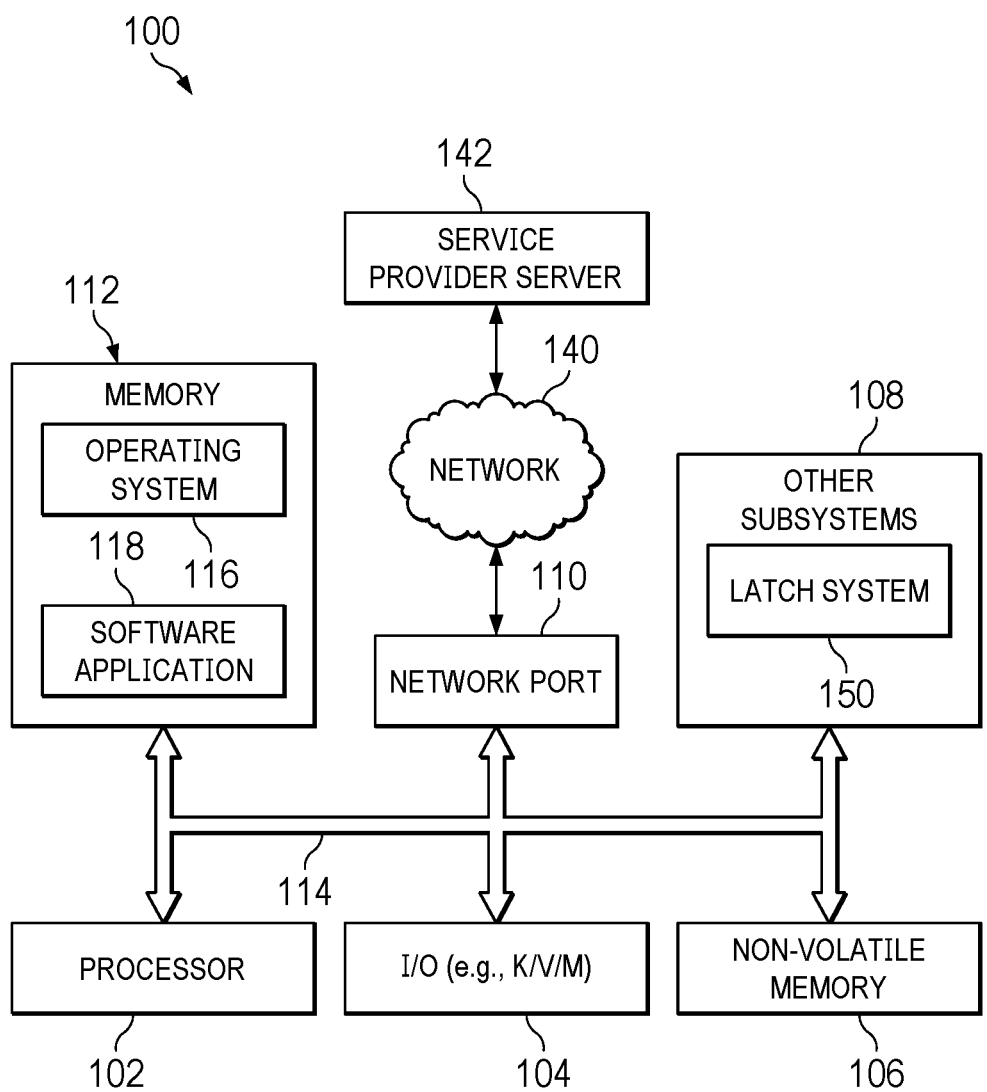
FIG. 1 shows a general illustration of components of an information handling system as implemented in the system and method of the present invention.

FIG. 1 shows a generalized illustration of an information handling system 100 that can be used to implement the system and method of the present invention. The information handling system 100 includes a processor (e.g., central processor unit or "CPU") 102, input/output (I/O) devices 104, such as a display, a keyboard, a mouse, and associated controllers, a hard drive or disk storage 106, and various other subsystems 108. In various embodiments, the information handling system 100 also includes network port 110 operable to connect to a network 140, which is likewise accessible by a service provider server 142. The information handling system 100 likewise includes system memory 112, which is interconnected to the foregoing via one or more buses 114. System memory 112 further comprises operating system (OS) 116. In certain embodiments, the information handling system 100 is one of a plurality of information handling systems within a data center. In certain embodiments, the information handling system 100 comprises a server type information handling system. In certain embodiments, the server type information handling system comprises a blade server type information handling system. As used herein, a blade server type information handling system broadly refers to an information handling system which is physically configured to be mounted within a server rack.

In certain embodiments, the information handling system 100 includes a latch system 150. In certain embodiments, the latch system 150 includes a captive screw with a limited height to fit within a dense server type information handling system such as a 1U rack unit server type information handling system.

In certain embodiments, the latch system 150 includes a server cover captive screw latch system. In certain embodiments, the latch system 150 includes an over-molded bracket capture screw component. In certain embodiments, the screw component includes a head, a shoulder, a non-threaded area, and a threaded area. In certain embodiments, the threaded area threads into an internal bracket of the latch and then can float within the non-threaded portion of the screw. In certain embodiments, the screw component includes a spring which biases the screw component toward the cover of the latch but would require a much larger upward force for the screw thread to engage and be removed. Therefore, the screw component is captured onto the latch lever with no chance of being completely unintentionally removed. Such a server cover captive screw latch system provides a low-cost solution that reliably locks a cover latch in the limited space of a dense server type information handling system such as a 1U rack unit server type information handling system.

Figure 2:
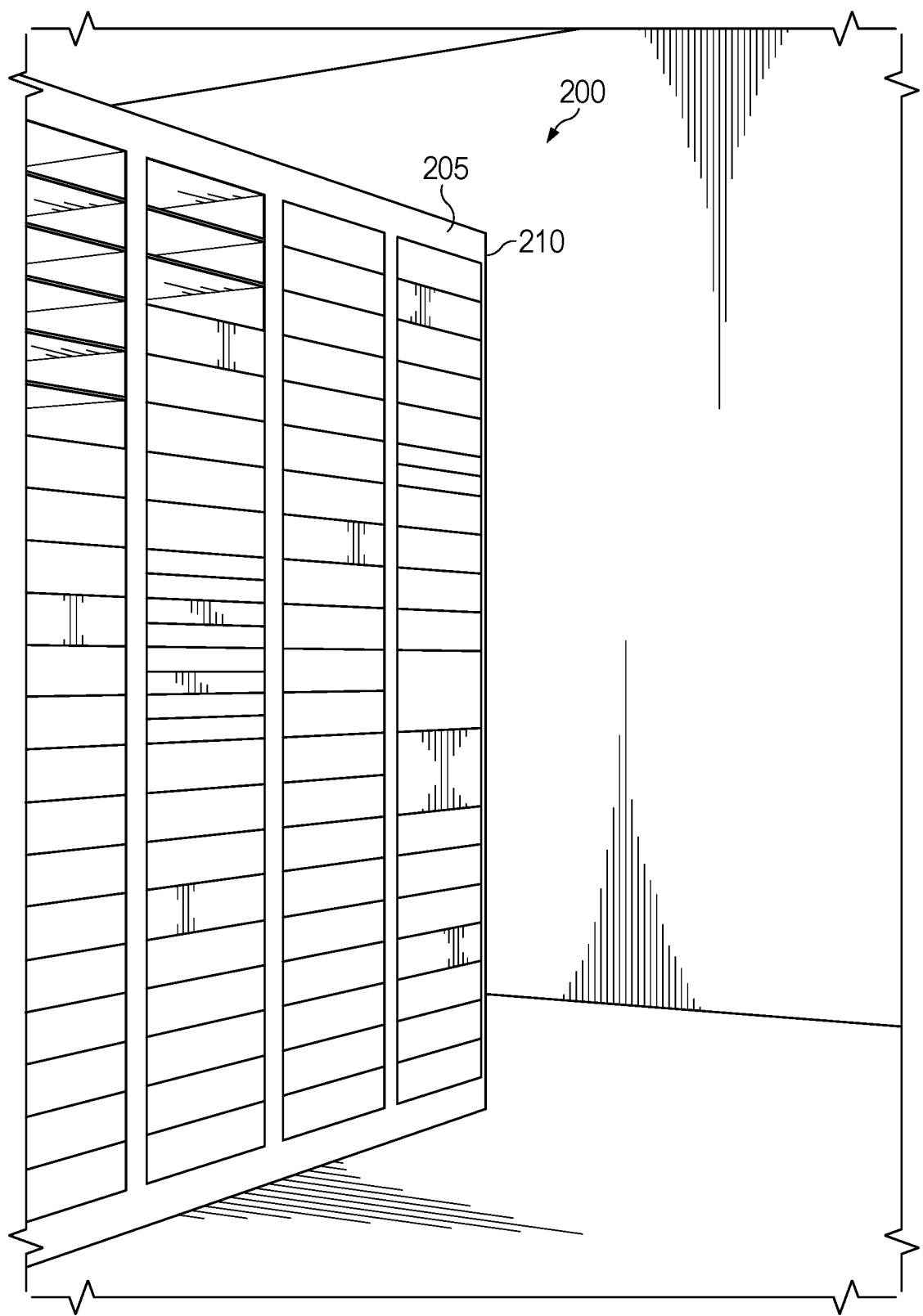
FIG. 2 shows a perspective view of a portion of a data center within an IT environment.

FIG. 2 shows a perspective view of a portion of an IT environment 200. The IT environment includes one or more racks 205 which include a plurality of information handling systems 100, often referred to as a server rack. In various embodiments, the IT environment 200 comprises a data center. As used herein, a data center refers to an IT environment which includes a plurality of networked information handling systems 100. In various embodiments, the information handling systems 100 of the data center include some or all of router type information handling systems, switch type information handling systems, firewall type information handling systems, storage system type information handling systems, server type information handling systems and application delivery controller type information handling systems. In certain environments, the information handling systems 100 are mounted within respective racks. As used herein, a rack refers to a physical structure that is designed to house the information handling systems 100 as well as the associated cabling and power provision for the information handling systems. In certain embodiments, a rack includes side panels to which the information handling systems are mounted. In certain embodiments, the rack includes a top panel and a bottom panel to which the side panels are attached. In certain embodiments, the side panels each include a front side panel and a rear side panel.

In certain embodiments, a plurality of racks is arranged continuous with each other to provide a rack system. An IT environment can include a plurality of rack systems arranged in rows with aisles via which IT service personnel can access information handling systems mounted in the racks. In certain embodiments, the aisles can include front aisles via which the front of the information handling systems may be accessed and hot aisles via which the infrastructure (e.g., data and power cabling) of the IT environment can be accessed.

Each respective rack includes a plurality of vertically arranged information handling systems 210. In certain embodiments, the information handling systems may conform to one of a plurality of standard server sizes. In certain embodiments, the plurality of server sizes conforms to particular rack unit sizes (i.e., rack units). As used herein, a rack unit broadly refers to a standardized server system height. As is known in the art, a server system height often conforms to one of a 1U rack unit, a 2U rack unit and a 4U rack unit. In general, a 1U rack unit is substantially (i.e., +/−20%) 1.75" high, a 2U rack unit is substantially (i.e., +/−20%) 3.5" high and a 4U rack height is substantially (i.e., +/−20%) 7.0" high.

Figure 3:
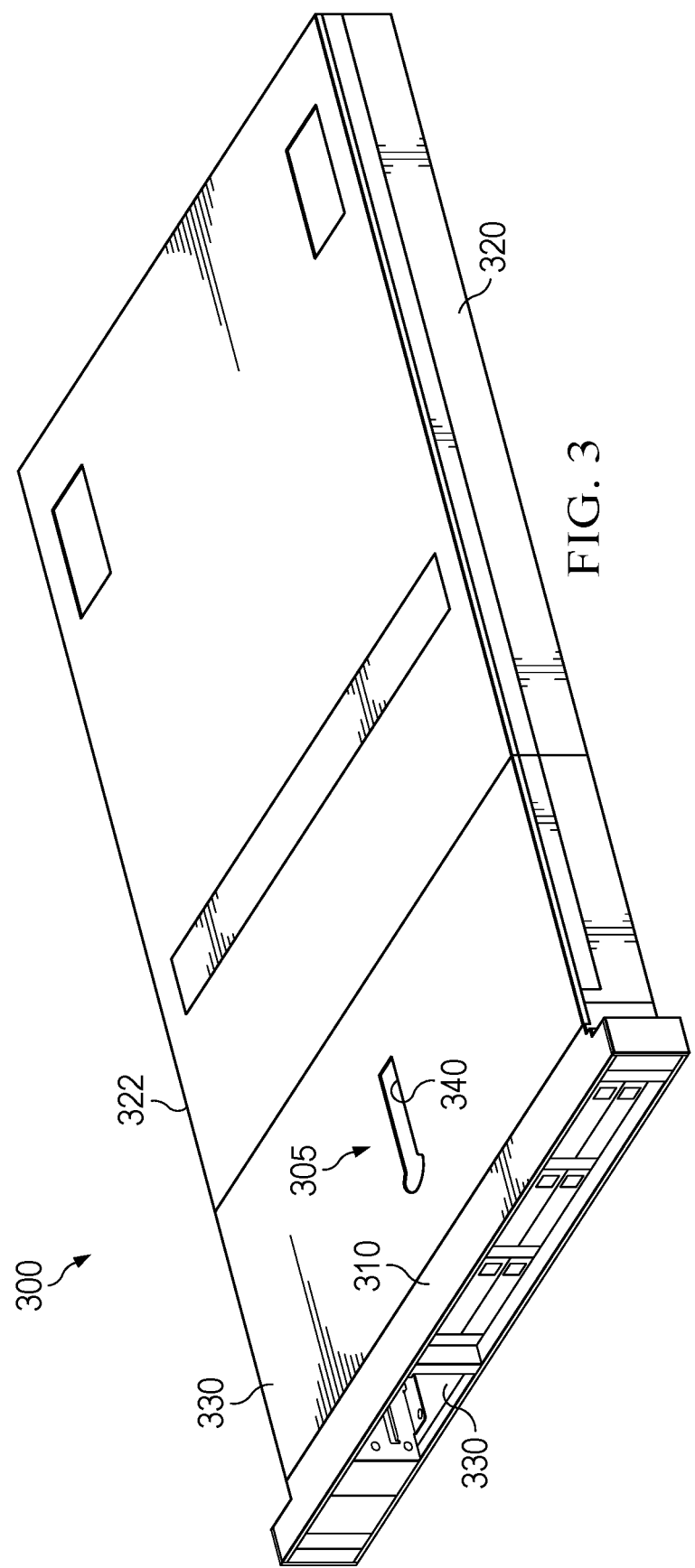
FIG. 3 shows a generalized perspective view of an example server type information handling system with server cover latch system.

FIG. 3 shows a generalized perspective view of an example server type information handling system 300 with server cover latch system 305. In certain embodiments, the server type information handing system 300 includes a chassis 307. In certain embodiments, the server type information handling system 300 is a 1U rack unit server type information handling system.

In certain embodiments, the server type information handling system chassis 307 includes a front portion 310, which is accessible when the server type information handing system 300 is mounted on a server rack. In certain embodiments, the server type information handling system chassis 307 includes side portions 320, 322. In certain embodiments, the side portions 320, 322 mount the server type information handling system 300 to a rack via respective server mounting components. In certain embodiments, the side portions 320, 322 mount to the rack via respective mechanical guiding features which are mechanically coupled to respective server mounting components. In certain embodiments, the server type information handling system 300 can slide out from the rack via the respective mechanical guiding features. In certain embodiments, the server type information handling system chassis 307 includes a top panel 330. In certain embodiments, internal components of the server type information handling system 300 may be accessed by removing the top panel 330 of the server type information handing system 300. In certain embodiments, a front edge of the top panel 330, a right side edge of the top panel 330, a left side edge of the top panel 330, or a combination thereof, engage with respective portions of the interior edges of information handling system chassis 307 to attach the top panel to the information handling system chassis 307.

In certain embodiments, the top panel 330 is attached to the front portion 310 and the side portions 320, 322 of the server type information handling system by activation of a server cover latch 340. In certain embodiments, the server cover latch 340 is attached to an underside of the top panel 330 of the server type information handling system 300. In certain embodiments, the top panel 330 defines an aperture via which the server cover latch 340 may be actuated. In certain embodiments, the front portion 310, top panel 330, the server cover latch 340, or a combination thereof, provide the server cover captive screw latch system 305.

In certain embodiments, server cover latch 340 fits within recesses defined by the top panel 330 such that the top of the server cover latch 340 is substantially flush with the top of the server type information handling system 300. By configuring the server cover captive screw latch 340 to be flush with the top of the server type information handling system 300, the server cover latch 340 does not impede extension of the server type information handling system 300 from a rack such as a rack 205.

Figure 4:
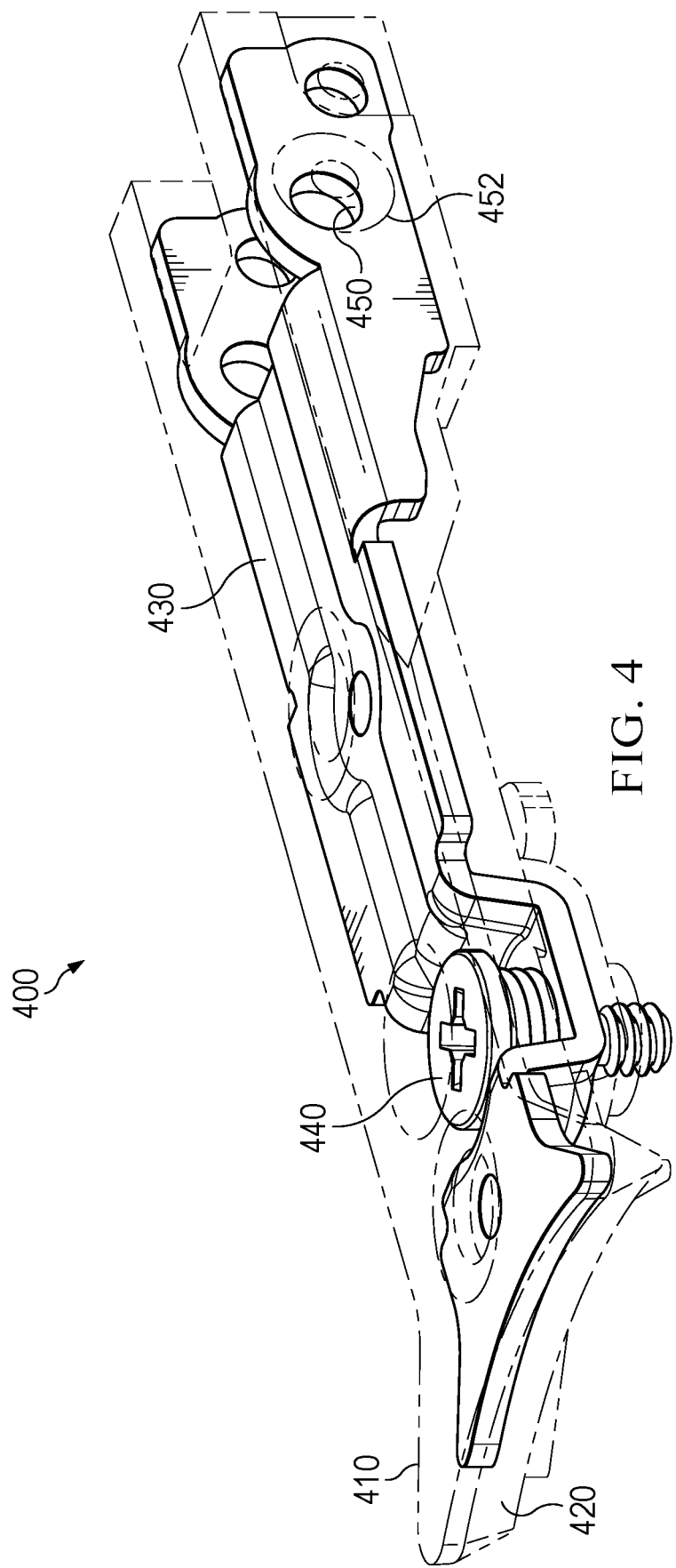
FIG. 4 shows a perspective view of a server cover latch.
Figure 5:
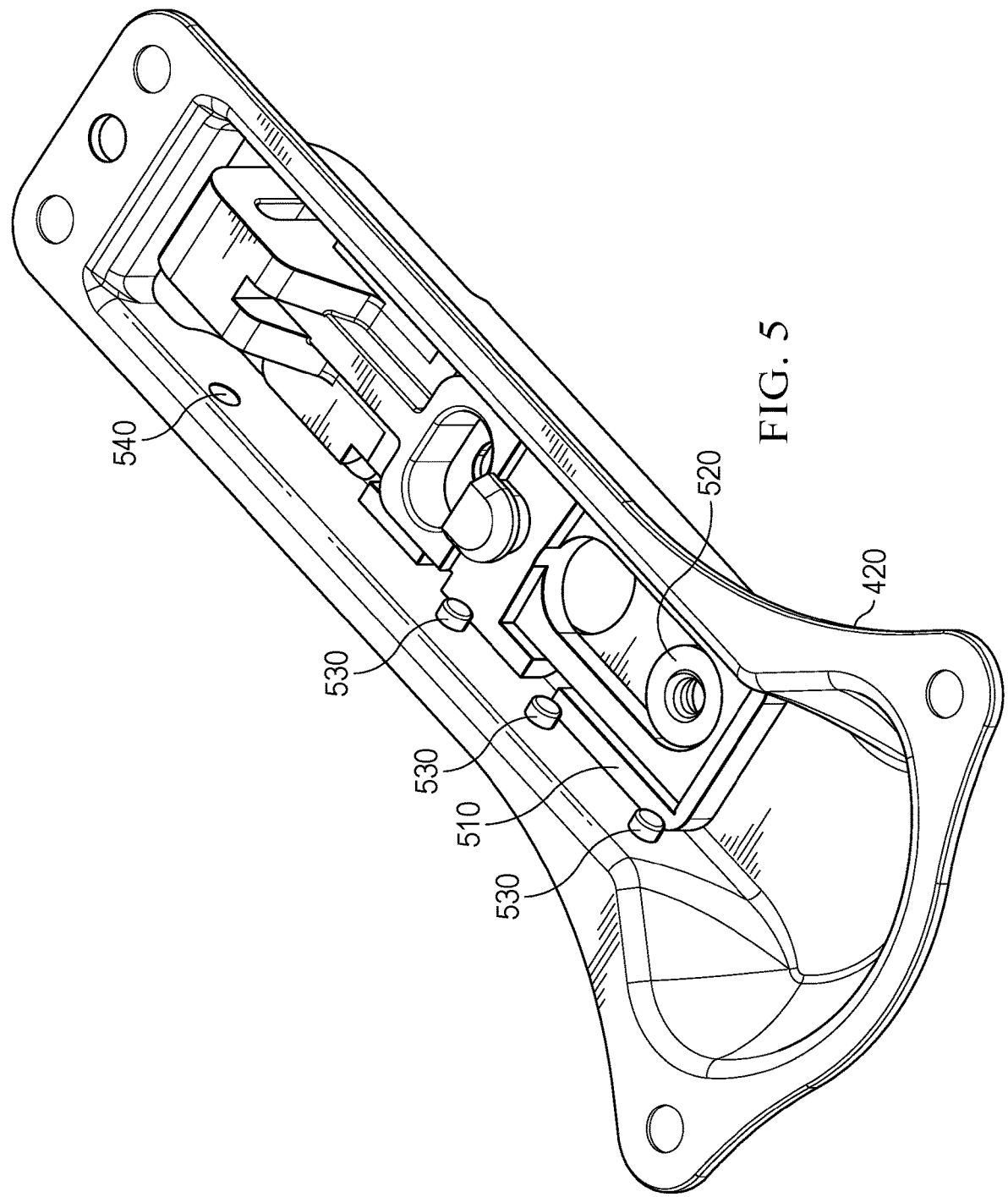
FIG. 5 shows a perspective view of a portion of a server cover.

FIG. 4 shows a perspective view of server cover latch 400. FIG. 5 shows a perspective view of a portion of a server cover latch. In certain embodiments, the server cover latch 400 includes a top housing portion 410, a bottom housing portion 420, a rotating bracket component 430 and a screw component 440. In certain embodiments, the rotating bracket component 430 defines apertures 450. In certain embodiments, the top housing portion 410 defines apertures 452. In certain embodiments, the server cover latch 400 includes a receptor bracket component 510.

In certain embodiments, the screw component 440 includes a spring loaded screw which is captured by the rotating bracket component 430. In certain embodiments, the bottom housing portion 420 includes a receptor nut 520. In certain embodiments, the receptor nut is available under the trade designation M3 PEM. In certain embodiments, one or both of the interior walls of the bottom housing portion include one or more projections 530. In certain embodiments, the projections 530 fix the receptor bracket component 510 in place within the bottom housing portion 420. In certain embodiments, the receptor bracket component 510 includes a pivot portion 540 about which the rotating bracket component 430 pivots between a latch open orientation and a latch closed orientation. In certain embodiments, the apertures 450, 452 align with the pivot portion 540 of the receptor bracket component 510. In certain embodiments, a pin (see e.g., FIG. 7) is fitted through the pivot portion 540 and the apertures 450, 452. In certain embodiments, the top housing portion 410, the rotating bracket component 430, or a combination thereof, pivot about the pin when rotating between the latch open orientation and the latch closed orientation.

In certain embodiments, the screw head of the screw component 440 is positioned to be flush to a top portion of the top housing portion when the screw component is unfastened from the receptor bracket component 510. By being so positioned, the screw component 440 is clear of an adjacent server in a rack when the information handling system is extended from the rack.

Figure 6:
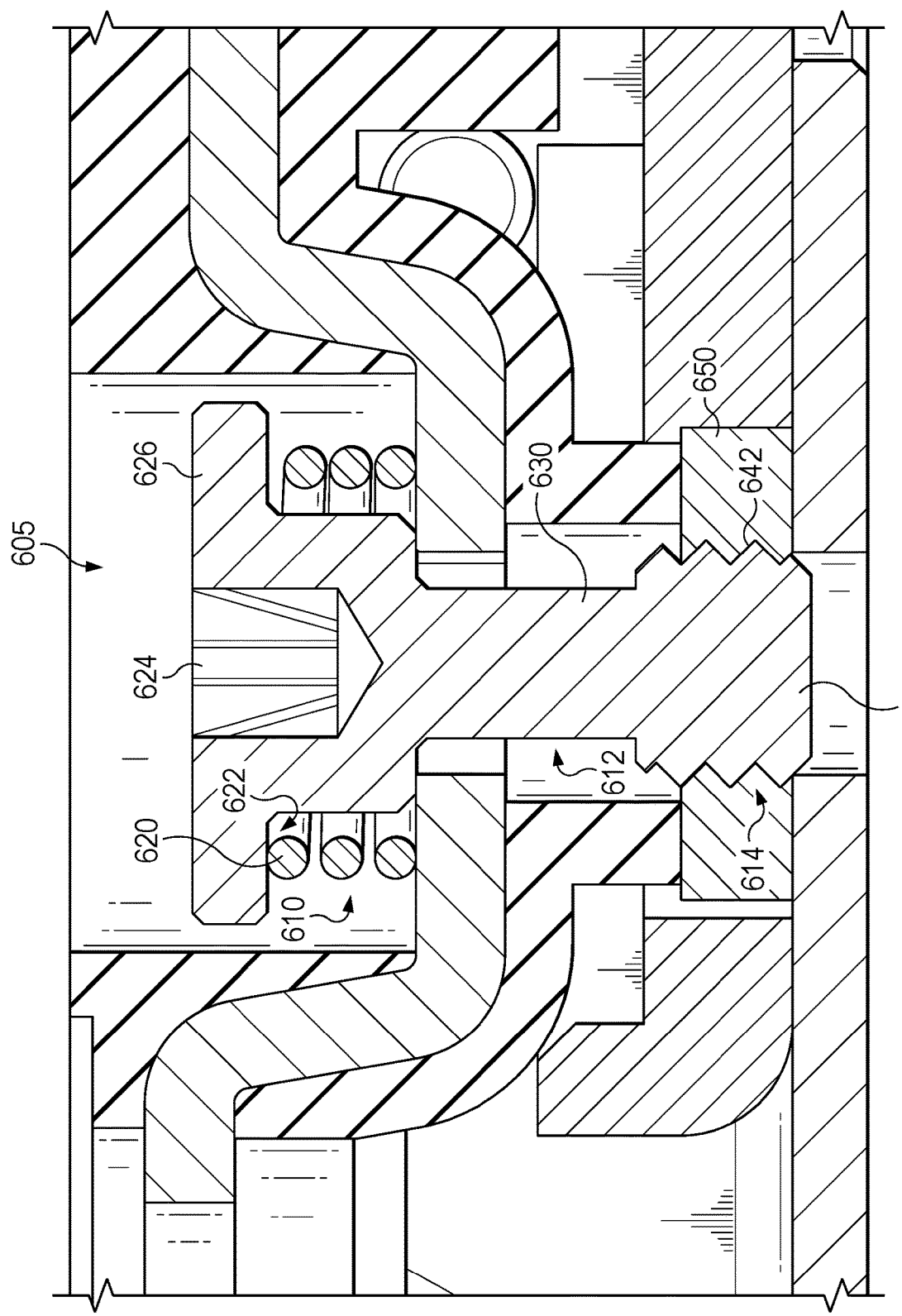
FIG. 6 shows a cross section of a portion of a server cover latch system.

FIG. 6 shows a cross section of a portion of a server cover latch system including a captive screw component 605. In certain embodiments, the captive screw component 605 includes a captive screw top portion 610, a captive screw middle portion 612, a captive screw bottom portion 614, or a combination thereof. In certain embodiments, the captive screw top portion 610 includes a spring component 620 which extends around a wall 622 of the captive screw top portion 610. In certain embodiments, the captive screw top portion 610 defines a driver receptor portion 624. In certain embodiments, the driver receptor portion 624 may be rotated via a driver, such as a screwdriver or coin, by coupling the driver with the driver receptor potion 624 and rotating the driver. In certain embodiments, the captive screw component 605 may be moved between an engaged orientation (as shown in FIG. 6) and a disengaged orientation by rotating the captive screw component 605. In certain embodiments, the engaged orientation affixes the server cover latch system. In certain embodiments, the disengaged orientation allows the server cover latch system to be rotated to an open configuration.

In certain embodiments, the screw head of the screw component 605 is positioned to be flush to a top portion of the top housing portion when the screw component is unfastened from the receptor nut 650. By being so positioned, the screw component 605 is clear of an adjacent server in a rack when the information handling system is extended from the rack.

In certain embodiments, the captive screw middle portion 612 includes a shaft 630 physically positioned between the captive screw top portion 610 and the captive screw bottom portion 614. In certain embodiments, the shaft 630 extends vertically between the captive screw top portion 610 and the captive screw bottom portion 614. In certain embodiments, the shaft 630 fits within an aperture defined by a rotating bracket component (such as rotating bracket component 430) so as to retain the captive screw component 605 (i.e., to movably secure the captive screw component 605 to the rotating bracket component) such that the captive screw component can vertically move between an engaged orientation and a disengaged orientation.

In certain embodiments, the captive screw bottom portion 614 includes a bottom edge 640 and a threaded portion 642. In certain embodiments, the threaded portion 640 engages with a receptor nut 650 when the captive screw component is in the engaged orientation. In certain embodiments, the bottom edge 640 fits within an aperture defined by a bottom housing portion (such as bottom housing portion 420) when the captive screw component is in the engaged orientation.

Figure 7:
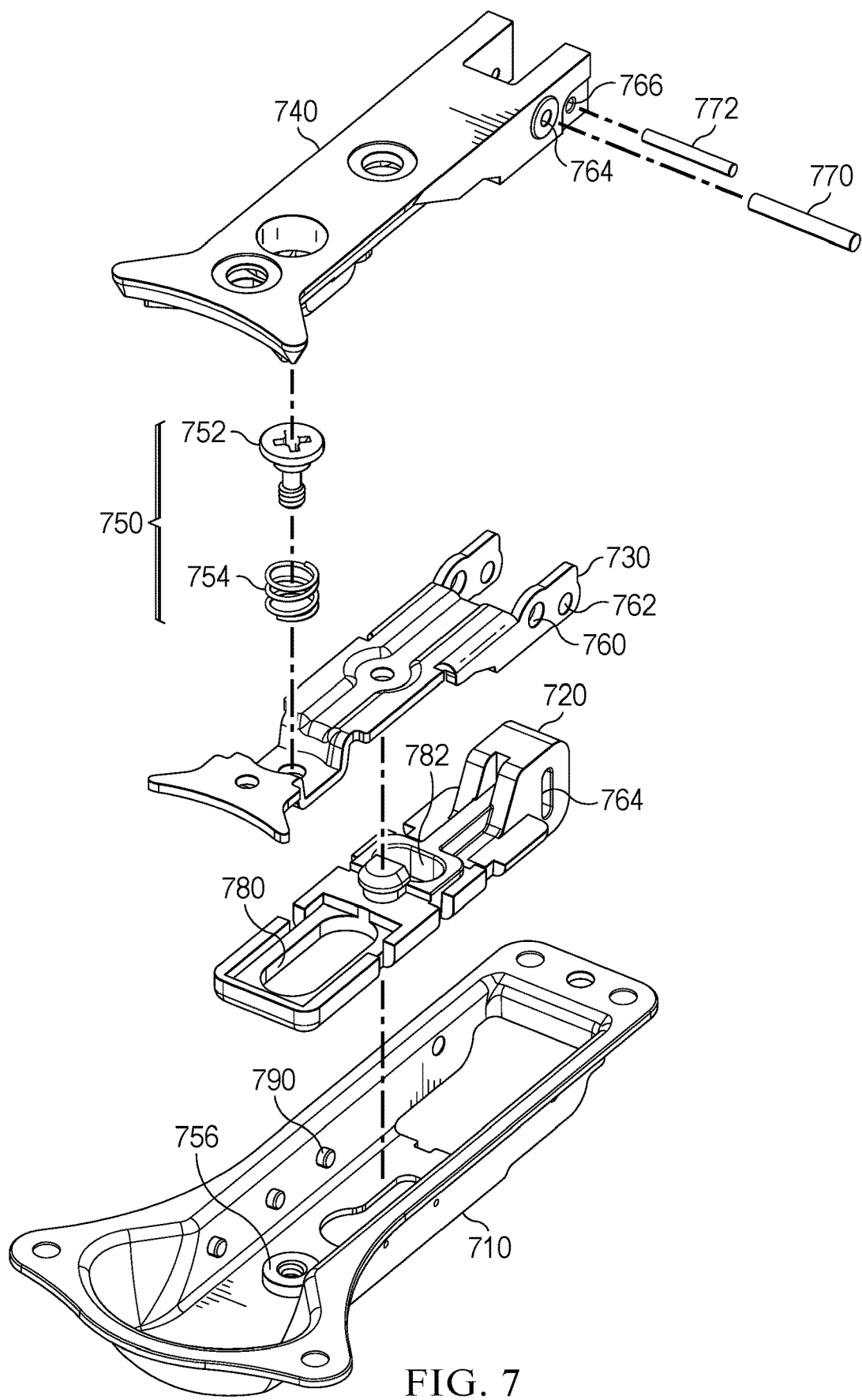
FIG. 7 shows an exploded view of a server cover latch system.
Figure 8A:
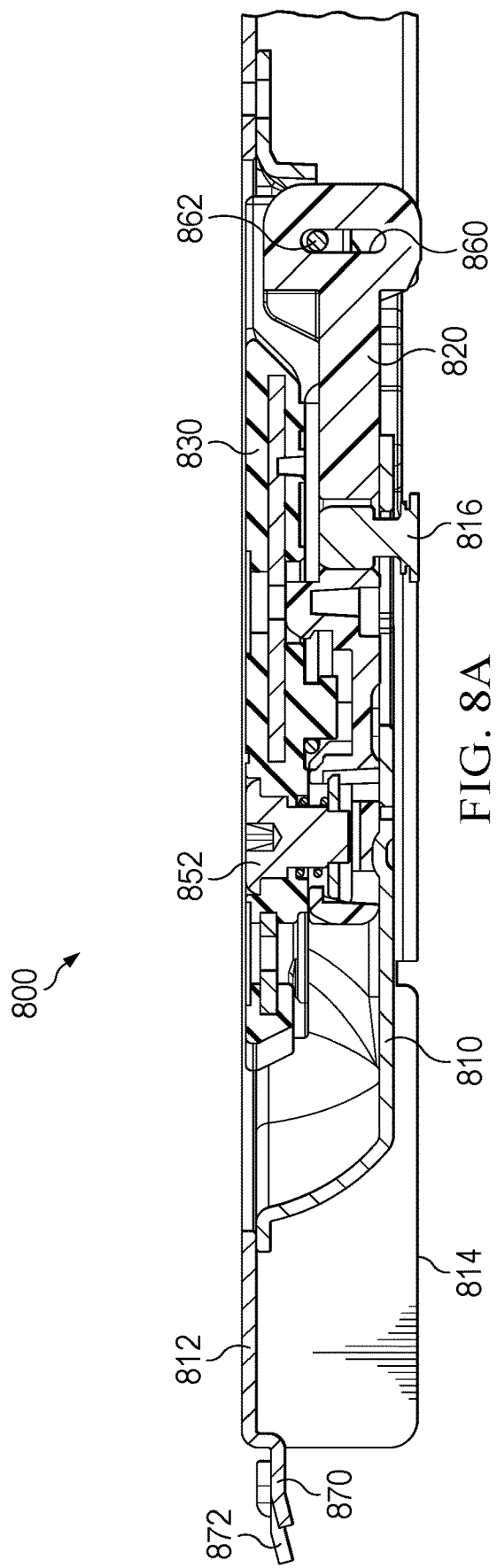
FIGS. 8A, 8B, 8C and 8D, respectively show a server cover latch system in a cut away side view in a closed configuration, a server cover latch system in a cut away perspective view in a closed configuration, a server cover latch system in a cut away side view in an open configuration, and a server cover latch system in a cut away perspective view in an open configuration.
Figure 8B:
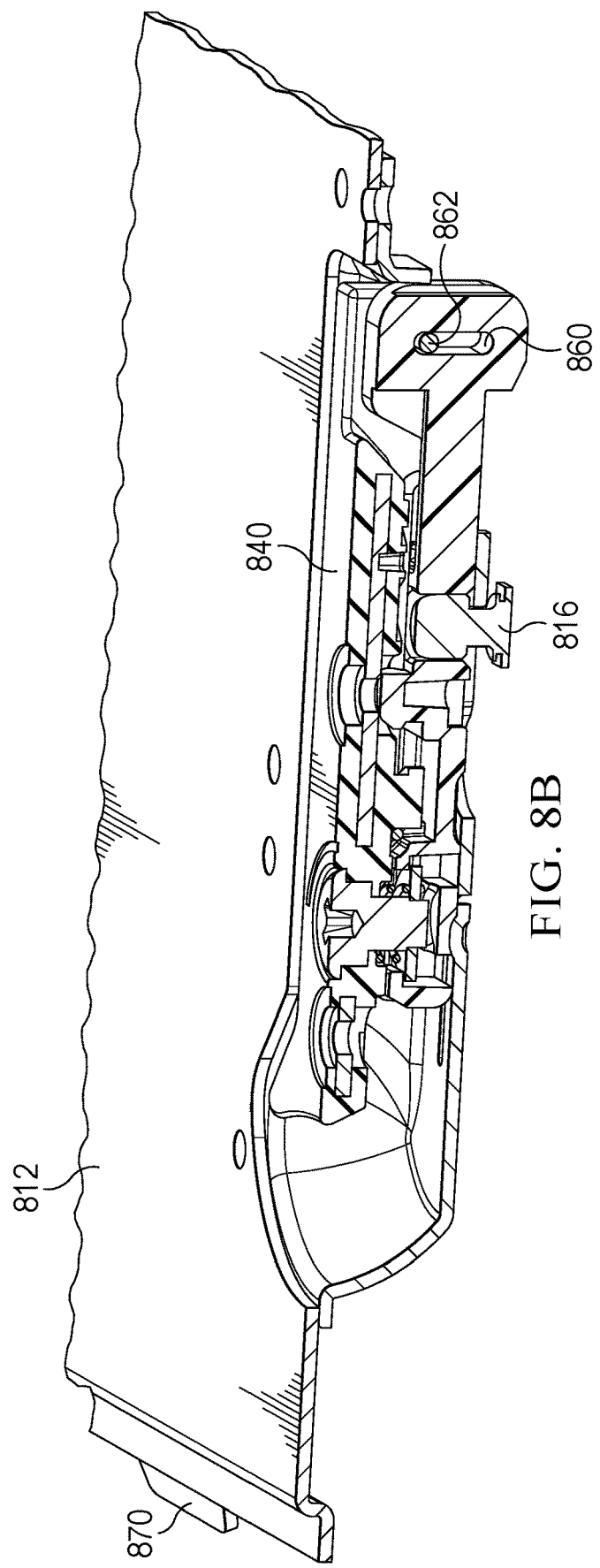
Figure 8C:
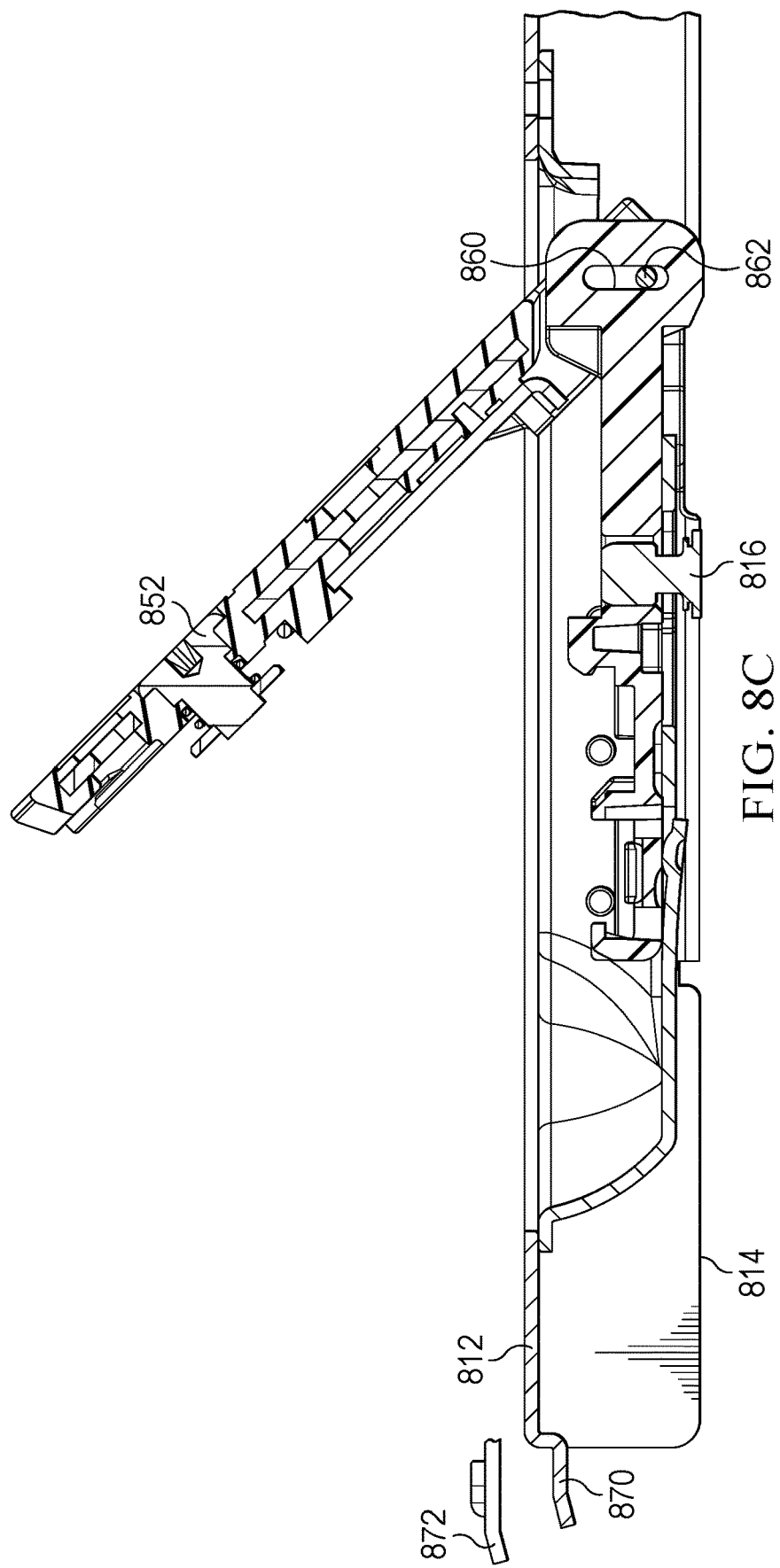
Figure 8D:
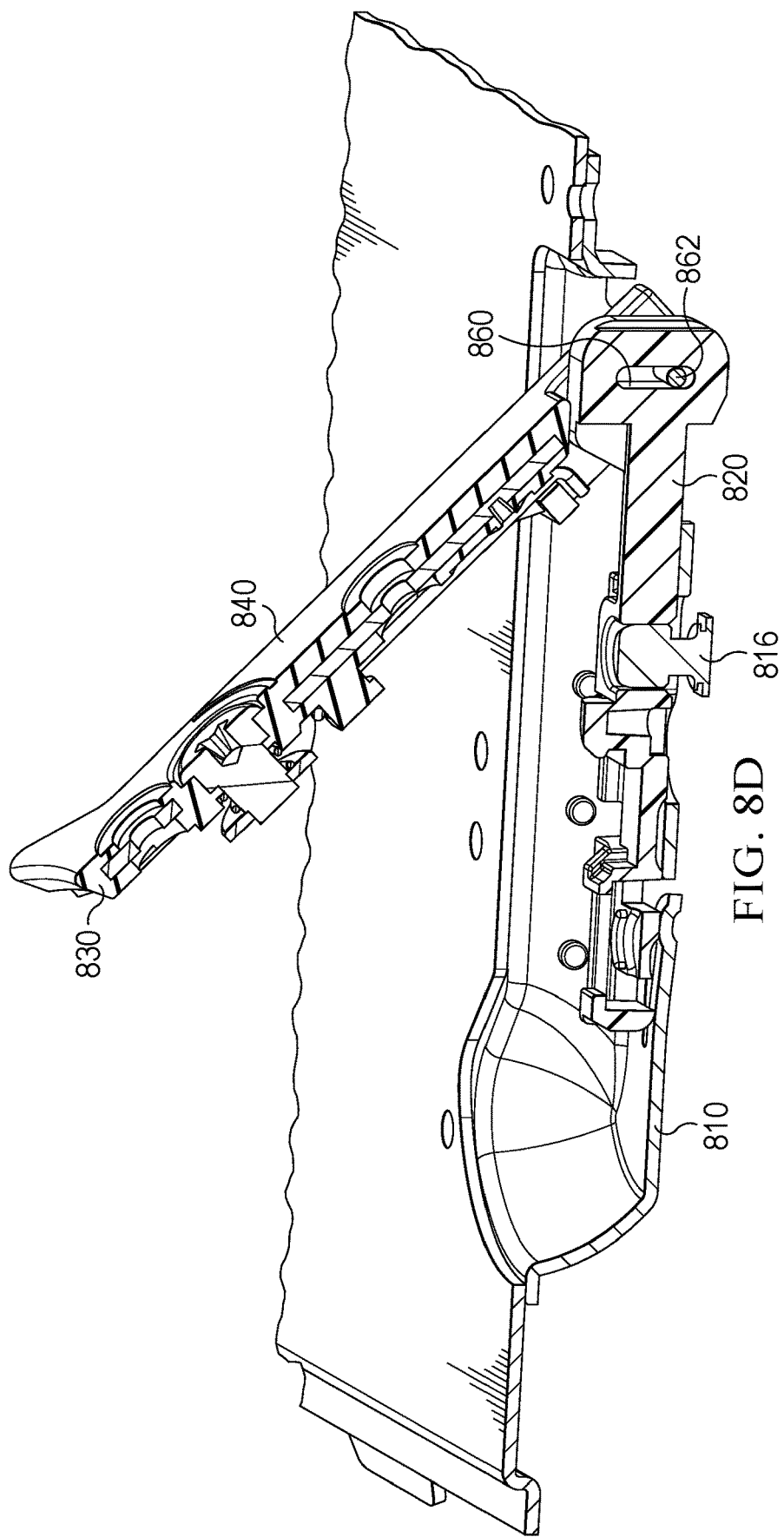

FIG. 7 shows an exploded view of a server cover latch 700. In certain embodiments, the server cover latch 700 includes a bottom housing portion 710, a receptor bracket component 720, a rotating bracket component 730, a top housing portion 740, and a screw component 750. In certain embodiments, the server cover latch 700 corresponds to server cover latch 400. In certain embodiments, the bottom housing portion 710 corresponds to bottom housing component 420, the receptor bracket component 720 corresponds to receptor bracket component 540, the rotating bracket component 730 corresponds to rotating bracket component 430, the top housing portion 740 corresponds to top housing component 410 and the screw component 750 corresponds to screw component 440.

In certain embodiments, the screw component 750 includes a screw 752 and a spring 754 which is captured by the rotating bracket component 730. In certain embodiments, the bottom housing portion 710 includes a receptor nut 756. In certain embodiments, the receptor nut is available under the trade designation M3 PEM.

In certain embodiments, the screw head of the screw component 740 is positioned to be flush to a top portion of the top housing portion when the screw component is unfastened from the receptor bracket component 720. By being so positioned, the screw component 740 is clear of an adjacent server in a rack when the information handling system is extended from the rack.

In certain embodiments, the rotating bracket component 730 defines apertures 760 and apertures 762. In certain embodiments, the top housing portion 740 defines apertures 766 and apertures 768. In certain embodiments, a pin 770 is fitted through the pivot portion 540 and the apertures 760, 766. In certain embodiments, the top housing portion 740, the rotating bracket component 730, or a combination thereof, pivot about the pin 770 when rotating between the latch open orientation and the latch closed orientation. In certain embodiments, when a pin 770 is inserted into the rotating bracket component 730 and the top housing portion 740, the pin 770 and the apertures 760 and 764 provide a pivot point about which the rotating bracket component 730 and the top housing portion 740 pivot between aa latch open orientation and a latch closed orientation.

In certain embodiments, the receptor bracket component 720 includes a guide slot 764 via which a pin 772 guides when the rotating bracket component 730 pivots from a latch closed orientation to a latch open orientation. In certain embodiments, the receptor bracket component 720 defines an extended oval slot 780. In certain embodiments, the screw component 750 fits through the extended oval slot 780 to attach to the receptor nut 756. In certain embodiments, the bottom housing component 710 defines a guide aperture along which a chassis pin guides when the rotating bracket component 730 pivots from a latch closed orientation to a latch open orientation. In certain embodiments, the receptor bracket component 720 includes a pin receptor 782 to which the chassis pin mates. In certain embodiments, the mating of the pin receptor 782 causes the top panel to move from a closed orientation to an open orientation when the rotating bracket component pivots from a latch closed orientation to a latch open orientation. In certain embodiments, the mating of the pin 772 with the guide slot 764 causes the receptor bracket component 720 to laterally move from a closed orientation to an open orientation when the rotating bracket component pivots from a latch closed orientation to a latch open orientation.

In certain embodiments, one or both of the interior walls of the bottom housing portion include one or more projections 790. In certain embodiments, the projections 790 fix the receptor bracket component 720 in place within the bottom housing portion 710. In certain embodiments, when the receptor bracket component is fixed in place by the projections 790, the receptor bracket can move laterally from a closed orientation to an open orientation when the rotating bracket component pivots from a latch closed orientation to a latch open orientation.

FIGS. 8A, 8B, 8C and 8D, respectively show a server cover latch system 800 in a cut away side view in a closed configuration, a server cover latch system 800 in a cut away perspective view in a closed configuration, a server cover latch system 800 in a cut away side view in an open configuration and a server cover latch system 800 in a cut away perspective view in an open configuration. In certain embodiments, the server cover latch system 800 includes a server cover latch 805. In certain embodiments, the server cover latch 805 includes a bottom housing portion 810. In certain embodiments, the sever cover latch system 800 includes a server cover latch 805, a server top panel 812, a server chassis portion 814, a server chassis pin 816, or a combination thereof. In certain embodiments, the server cover latch 805 includes a receptor bracket component 820, a rotating bracket component 830, a top housing portion 840, and a screw component 850. In certain embodiments, the server cover latch 800 corresponds to server cover latch 400. In certain embodiments, the bottom housing portion 810 corresponds to bottom housing component 420, the receptor bracket component 820 corresponds to receptor bracket component 540, the rotating bracket component 830 corresponds to rotating bracket component 430, the top housing portion 840 corresponds to top housing component 410 and the screw component 850 corresponds to screw component 440.

In certain embodiments, the rotating bracket component 830 defines apertures 850 and apertures 852. In certain embodiments, the top housing portion 840 defines apertures 854 and apertures 855. In certain embodiments, a pin 860 is fitted through the pivot portion 540 and the apertures 850, 852. In certain embodiments, the top housing portion 840, the rotating bracket component 830, or a combination thereof, pivot about the pin when rotating between the latch open orientation and the latch closed orientation. In certain embodiments, when a pin 860 is inserted into the rotating bracket component 830 and the top housing portion 840, the pin 860 and the apertures 850 and 854 provide a pivot point about which the rotating bracket component 830 and the top housing portion 840 pivot between aa latch open orientation and a latch closed orientation.

In certain embodiments, the receptor bracket component 820 includes a guide slot 864 via which a guide pin 862 guides when the rotating bracket component 830 pivots from a latch closed orientation to a latch open orientation. In certain embodiments, the receptor bracket component 820 defines an extended oval slot 870. In certain embodiments, the screw component 850 fits through the extended oval slot 870 to attach to the receptor nut 856. In certain embodiments, the bottom housing component 810 defines a guide aperture along which the 816 chassis pin guides when the rotating bracket component 830 pivots from a latch closed orientation to a latch open orientation. In certain embodiments, the receptor bracket component 820 includes a pin receptor 874 to which the chassis pin 816 mates. In certain embodiments, the mating of the pin receptor 874 causes the top panel to move from a closed orientation to an open orientation when the rotating bracket component pivots from a latch closed orientation to a latch open orientation. In certain embodiments, the mating of the pin 862 with the guide slot 864 causes the receptor bracket component 820 to laterally move from a closed orientation to an open orientation when the rotating bracket component pivots from a latch closed orientation to a latch open orientation.

In certain embodiments, the top panel 812 includes one or more locking tabs 880 which interact with projections extending from the interior of a front panel of the server chassis, a right side panel of the server chassis, a left side panel of the server chassis, or a combination thereof to hold the top panel in place when the latch system 800 is in a closed orientation.

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only, and are not exhaustive of the scope of the invention.

Consequently, the invention is intended to be limited only by the spirit and scope of the appended claims, giving full cognizance to equivalents in all respects.

What is claimed is:

1. A server cover latch, comprising:
a rotating bracket component;
a receptor bracket component, the rotating bracket component pivoting about a portion of the receptor bracket component when the rotating bracket component pivots between a latch open orientation and a latch closed orientation; and
a bottom housing portion, the receptor bracket component moving laterally within the bottom housing portion when the rotating bracket component pivots between a latch open orientation and a latch closed orientation; and wherein
the receptor bracket component includes a server chassis pin receptor, the server chassis pin receptor being configured to physically mate with a server chassis pin;
the rotating bracket component includes a guide pin; and,
the receptor bracket component defines a guide slot, the guide slot mating with the guide pin such that the guide pin moves vertically within the guide slot when the rotating bracket component pivots between a latch open orientation and a latch closed orientation.

2. The server cover latch of claim 1, further comprising:
a screw component, the screw component comprising a screw captured by the rotating bracket component.

3. The server cover latch of claim 2, further comprising:
a top housing portion physically attached to the rotating bracket component, the top housing portion defining a screw component aperture, the screw component being substantially flush with a top side of the top housing portion when rotating bracket component is in the latch closed orientation.

4. The server cover latch of claim 2, wherein:
the screw component comprises a captive screw top portion, a captive screw middle portion, and a captive screw bottom portion;
the captive screw top portion includes a spring component extending around a wall of the captive screw top portion; and,
the screw component extends vertically between an engaged orientation and a disengaged orientation due to force exerted by the spring against the rotating bracket component.

5. A server cover latch system comprising:
a top panel; and,
a server cover latch coupled to the top panel; the server cover latch comprising a rotating bracket component;
a receptor bracket component, the rotating bracket component pivoting about a portion of the receptor bracket component when the rotating bracket component pivots between a latch open orientation and a latch closed orientation; and
a bottom housing portion physically coupled to the top panel, the receptor bracket component moving laterally within the bottom housing portion when the rotating bracket component pivots between a latch open orientation and a latch closed orientation; and wherein
the receptor bracket component includes a server chassis pin receptor, the server chassis pin receptor being configured to physically mate with a server chassis pin;
the rotating bracket component includes a guide pin; and,
the receptor bracket component defines a guide slot, the guide slot mating with the guide pin such that the guide pin moves vertically within the guide slot when the rotating bracket component pivots between a latch open orientation and a latch closed orientation.

6. The server cover latch system of claim 5, wherein the server cover latch further comprises:
a screw component, the screw component comprising a screw captured by the rotating bracket component.

7. The server cover latch system of claim 6, wherein the server cover latch further comprises:
a top housing portion physically attached to the rotating bracket component, the top housing portion defining a screw component aperture, the screw component being substantially flush with a top side of the top housing portion when rotating bracket component is in the latch closed orientation.

8. The server cover latch system of claim 6, wherein:
the screw component comprises a captive screw top portion, a captive screw middle portion, and a captive screw bottom portion;
the captive screw top portion includes a spring component extending around a wall of the captive screw top portion; and,
the screw component extends vertically between an engaged orientation and a disengaged orientation due to force exerted by the spring against the rotating bracket component.

9. A system comprising:
a chassis;
a processor contained within the chassis;
a data bus coupled to the processor; and,
a server cover latch system comprising:
a top panel;
a server cover latch coupled to the top panel; the server cover latch comprising
a rotating bracket component;
a receptor bracket component, the rotating bracket component pivoting about a portion of the receptor bracket component when the rotating bracket component pivots between a latch open orientation and a latch closed orientation; and
a bottom housing portion physically coupled to the top panel, the receptor bracket component moving laterally within the bottom housing portion when the rotating bracket component pivots between a latch open orientation and a latch closed orientation; and wherein
the receptor bracket component includes a server chassis pin receptor, the server chassis pin receptor being configured to physically mate with a server chassis pin;
the rotating bracket component includes a guide pin; and,
the receptor bracket component defines a guide slot, the guide slot mating with the guide pin such that the guide pin moves vertically within the guide slot when the rotating bracket component pivots between a latch open orientation and a latch closed orientation.

10. The system of claim 9, wherein the server cover latch further comprises:
a screw component, the screw component comprising a screw captured by the rotating bracket component.

11. The system of claim 10, wherein the server cover latch further comprises:
a top housing portion physically attached to the rotating bracket component, the top housing portion defining a screw component aperture, the screw component being substantially flush with a top side of the top housing portion when rotating bracket component is in the latch closed orientation.

12. The system of claim 10, wherein:
the screw component comprises a captive screw top portion, a captive screw middle portion, and a captive screw bottom portion;
the captive screw top portion includes a spring component extending around a wall of the captive screw top portion; and,
the screw component extends vertically between an engaged orientation and a disengaged orientation due to force exerted by the spring against the rotating bracket component.

* * * * *